(12) United States Patent
Yu

(10) Patent No.: US 12,745,643 B2
(45) Date of Patent: Sep. 22, 2026

(54) SEMICONDUCTOR PACKAGE INCLUDING SUPPORT MEMBER

(71) Applicant: Samsung Electronics Co., Ltd., Suwon-si (KR)

(72) Inventor: Bong Ken Yu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 18/241,531

(22) Filed: Sep. 1, 2023

(65) Prior Publication Data

US 2024/0096819 A1 Mar. 21, 2024

(30) Foreign Application Priority Data

Sep. 15, 2022 (KR) ........................ 10-2022-0116145

(51) Int. Cl.
*H10W 42/00* (2026.01)
*H10B 80/00* (2023.01)
(Continued)

(52) U.S. Cl.
CPC .......... *H10W 42/121* (2026.01); *H10B 80/00* (2023.02); *H10W 70/685* (2026.01);
(Continued)

(58) Field of Classification Search
CPC ............... H01L 23/562; H01L 23/3128; H01L 23/49822; H01L 23/49833; H01L 23/49811; H01L 23/49816; H01L 23/5385; H01L 23/5389; H01L 24/13; H01L 24/16; H01L 24/17; H01L 25/18; H01L 25/105; H10B 80/00; H10W 42/121;
(Continued)

(56) References Cited

U.S. PATENT DOCUMENTS 7,619,305 B2 11/2009 Fan et al.
8,786,069 B1 7/2014 Haba et al.
(Continued)

FOREIGN PATENT DOCUMENTS

CN 113838840 A * 12/2021 ............ H01L 21/56
KR 102061342 B1 1/2020
(Continued)

*Primary Examiner* — Ida M Soward
(74) *Attorney, Agent, or Firm* — Muir Patent Law, PLLC

(57) ABSTRACT

There is provided a semiconductor package in which warpage of an interposer is prevented to improve product reliability. The semiconductor package includes a first substrate including a first insulating layer, and a first conductive pattern disposed in the first insulating layer, a semiconductor chip disposed on the first substrate, an interposer disposed on the semiconductor chip, wherein the interposer includes a second insulating layer, and a second conductive pattern disposed in the second insulating layer, a support member disposed on a bottom surface of the second insulating layer and in contact with an upper surface of the semiconductor chip, wherein the support member includes a first lower pad and a bump disposed under the first lower pad and a first connection member disposed between the first substrate and the interposer so as to connect the first conductive pattern and the second conductive pattern to each other.

19 Claims, 20 Drawing Sheets

(51) Int. Cl.

| | |
|---|---|
| ***H10W 70/685*** | (2026.01) |
| ***H10W 74/10*** | (2026.01) |
| ***H10W 90/00*** | (2026.01) |
| *H10W 72/20* | (2026.01) |

(52) U.S. Cl.

CPC .......... *H10W 74/117* (2026.01); *H10W 90/00* (2026.01); *H10W 90/401* (2026.01); *H10W 72/222* (2026.01); *H10W 72/252* (2026.01); *H10W 90/724* (2026.01)

(58) Field of Classification Search

CPC . H10W 70/685; H10W 70/60; H10W 70/611; H10W 70/614; H10W 74/117; H10W 90/00; H10W 90/401; H10W 90/724; H10W 90/288; H10W 90/722; H10W 90/701; H10W 72/222; H10W 72/252; H10W 72/247; H10W 72/20

See application file for complete search history.

(56) References Cited

U.S. PATENT DOCUMENTS

| | | | | |
|---|---|---|---|---|
| 9,349,713 | B2 * | 5/2016 | Kim | H10W 74/014 |
| 9,633,966 | B2 | 4/2017 | Park et al. | |
| 9,691,708 | B1 * | 6/2017 | Huang | H10W 70/614 |
| 9,773,723 | B2 | 9/2017 | Haba | |
| 10,096,563 | B2 * | 10/2018 | Chen | H10W 70/60 |
| 11,075,151 | B2 * | 7/2021 | Tsai | H01L 24/92 |
| 2008/0142940 | A1 * | 6/2008 | Dunne | H05K 1/186 257/E21.001 |
| 2011/0298125 | A1 * | 12/2011 | Ko | H01L 25/105 257/738 |
| 2012/0020040 | A1 | 1/2012 | Lin et al. | |
| 2013/0334683 | A1 * | 12/2013 | Kim | H01L 24/19 257/737 |
| 2014/0103488 | A1 * | 4/2014 | Chen | H10W 20/063 257/532 |
| 2014/0367854 | A1 | 12/2014 | Zhao et al. | |
| 2017/0084589 | A1 * | 3/2017 | Kuo | H10W 70/614 |
| 2018/0247916 | A1 * | 8/2018 | Lee | H10W 90/00 |
| 2018/0301406 | A1 * | 10/2018 | Cho | H01L 21/565 |
| 2019/0051604 | A1 * | 2/2019 | Yu | H10W 70/635 |
| 2019/0115325 | A1 * | 4/2019 | Im | H01L 23/3677 |
| 2020/0220250 | A1 * | 7/2020 | Chih | H01Q 1/2283 |
| 2021/0183777 | A1 | 6/2021 | Yim et al. | |
| 2021/0384161 | A1 * | 12/2021 | Song | H10P 72/74 |
| 2022/0005793 | A1 * | 1/2022 | Kang | H01L 25/105 |
| 2022/0013464 | A1 * | 1/2022 | Shim | H01L 23/5389 |
| 2022/0189835 | A1 * | 6/2022 | Yim | H01L 23/5384 |
| 2022/0352130 | A1 * | 11/2022 | Lee | H01L 24/33 |
| 2023/0082412 | A1 * | 3/2023 | Lee | H01L 23/5385 257/712 |

FOREIGN PATENT DOCUMENTS

| | | | | |
|---|---|---|---|---|
| KR | 1020200011007 A | | 1/2020 | |
| KR | 1020210122000 A | | 10/2021 | |
| KR | 20220085624 A | * | 6/2022 | H10W 90/401 |

* cited by examiner

SEMICONDUCTOR PACKAGE INCLUDING SUPPORT MEMBER

CROSS-REFERENCE TO RELATED APPLICATION

This application claims priority from Korean Patent Application No. 10-2022-0116145 filed on Sep. 15, 2022 in the Korean Intellectual Property Office, and all the benefits accruing therefrom under 35 U.S.C. 119, the contents of which in its entirety are herein incorporated by reference.

BACKGROUND

Technical Field

The present disclosure relates to a semiconductor package. More specifically, the present disclosure relates to a semiconductor package including an interposer.

Description of Related Art

Due to development of the electronic industry, demand for high-functionality, high-speed, and miniaturization of electronic components is increasing. In response to this trend, a scheme of stacking and mounting several semiconductor chips on one package substrate or stacking packages on top of each other may be employed. For example, a package-in-package (PIP) type semiconductor package or a package-on-package (POP) type semiconductor package may be used.

The POP-type semiconductor package may include an upper package, a lower package, and an interposer disposed between the upper package and the lower package so as to electrically connect the upper package and the lower package with each other. The interposer may facilitate the connection between the upper package and the lower package, and may prevent warpage of the upper package and the lower package. As the POP type semiconductor package becomes smaller, it is desirable to reduce a thickness of the interposer. Therefore, a possibility of warpage of the interposer is increasing.

SUMMARY

A technical purpose to be achieved by the present disclosure is to provide a semiconductor package in which warpage of an interposer is prevented to improve product reliability.

Purposes as disclosed in the present disclosure are not limited to the above-mentioned purpose. Other purposes and advantages that are not mentioned in the present disclosure may be understood based on following descriptions, and may be more clearly understood based on embodiments according to the present disclosure. Further, it will be easily understood that the purposes and advantages according to the present disclosure may be realized using means shown in the claims or combinations thereof.

According to some embodiments of the present disclosure, there is provided a semiconductor package comprising a first substrate including a first insulating layer, and a first conductive pattern disposed in the first insulating layer, a semiconductor chip disposed on the first substrate, an interposer disposed on the semiconductor chip, wherein the interposer includes a second insulating layer, and a second conductive pattern disposed in the second insulating layer, a support member disposed on a bottom surface of the second insulating layer and contacting an upper surface of the semiconductor chip, wherein the support member includes a first lower pad and a bump disposed under the first lower pad and a first connection member disposed between the first substrate and the interposer and connecting the first conductive pattern to the second conductive pattern.

According to some embodiments of the present disclosure, there is provided a semiconductor package comprising a first substrate including a first insulating layer, and a first conductive pattern disposed in the first insulating layer, a first semiconductor chip disposed on the first substrate, a plurality of bumps, each bump including a first end having a first area and a second end having a second area, wherein the first end contacts an upper surface of the first semiconductor chip and the second end is disposed between the first end and the first semiconductor chip, an interposer disposed on the plurality of bumps, wherein the interposer includes a second insulating layer, and a second conductive pattern disposed in the second insulating layer; and a first connection member disposed between the interposer and the first substrate, wherein the first connection member is spaced apart from the first semiconductor chip, wherein the first connection member electrically connects the first conductive pattern to the second conductive pattern.

According to some embodiments of the present disclosure, there is provided a semiconductor package comprising a first substrate including a first insulating layer, and a first conductive pattern disposed in the first insulating layer, a first semiconductor chip mounted on the first substrate, an interposer disposed on the first substrate, and spaced apart from the first semiconductor chip, wherein the interposer includes a second insulating layer, and a second conductive pattern disposed in the second insulating layer, a support member disposed on a bottom surface of the second insulating layer and contacting an upper surface of the first semiconductor chip, wherein the support member includes a first lower pad and a bump disposed under the first lower pad, a first connection member disposed between the first substrate and the interposer, and spaced apart from the first semiconductor chip, wherein the first connection member connects the first conductive pattern to the second conductive pattern, a second substrate disposed on the interposer and a second semiconductor chip mounted on the second substrate. The bump includes a first end having a first area, and a second end having a second area disposed under the first end. The first end of the bump contacts the first lower pad. A first width of the first area is greater than a second width of the second area. The first and second widths of the bump are measured in a direction parallel to an upper surface of the first substrate.

BRIEF DESCRIPTION OF DRAWINGS

The above and other aspects and features of the present disclosure will become more apparent by describing in detail illustrative embodiments thereof with reference to the attached drawings, in which:

FIG. 4 is a cross-sectional view illustrating a semiconductor package according to one embodiment.

FIG. 10 is a cross-sectional view illustrating a semiconductor package according to an embodiment.

DETAILED DESCRIPTIONS

Figure 1:
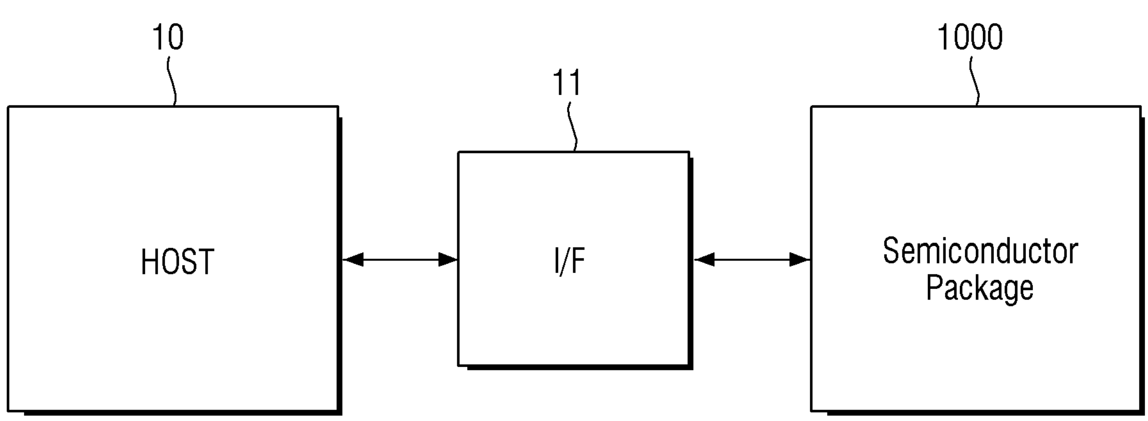
FIG. 1 is a diagram illustrating an electronic device according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents that may be included within the spirit and scope of the present disclosure.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms “a” and “an” are intended to include the plural forms as well, unless the context clearly indicates otherwise. It will be further understood that the terms “comprises”, “comprising”, “includes”, and “including” when used in this specification, specify the presence of the stated features, integers, operations, elements, and/or components, but do not preclude the presence or addition of one or more other features, integers, operations, elements, components, and/or portions thereof. As used herein, the term “and/or” includes any and all combinations of one or more of the associated listed items. Expressions such as “at least one of” when preceding a list of elements may modify an entirety of list of elements and may not modify the individual elements of the list. When referring to “C to D”, this means C inclusive to D inclusive unless otherwise specified.

It will be understood that, although the terms “first”, “second”, “third”, and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present “on” or “beneath” a second element or layer, the first element may be disposed directly on or beneath the second element or may be disposed indirectly on or beneath the second element with a third element or layer being disposed between the first and second elements or layers. It will be understood that when an element or layer is referred to as being “connected to”, or “coupled to” another element or layer, it may be directly on, connected to, or coupled to the other element or layer, or one or more intervening elements or layers may be present. In addition, it will also be understood that when an element or layer is referred to as being “between” two elements or layers, it may be the only element or layer between the two elements or layers, or one or more intervening elements or layers may also be present.

Further, as used herein, when a layer, film, region, plate, or the like may be disposed “on” or “on a top” of another layer, film, region, plate, or the like, the former may directly contact the latter or still another layer, film, region, plate, or the like may be disposed between the former and the latter. As used herein, when a layer, film, region, plate, or the like is directly disposed “on” or “on a top” of another layer, film, region, plate, or the like, the former directly contacts the latter and still another layer, film, region, plate, or the like is not disposed between the former and the latter. Further, as used herein, when a layer, film, region, plate, or the like may be disposed “below” or “under” another layer, film, region, plate, or the like, the former may directly contact the latter or still another layer, film, region, plate, or the like may be disposed between the former and the latter. As used herein, when a layer, film, region, plate, or the like is directly disposed “below” or “under” another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as “after”, “subsequent to”, “before”, etc., another event may occur therebetween unless “directly after”, “directly subsequent” or “directly before” is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as “beneath,” “below,” “lower,” “under,” “above,” “upper,” and the like, may be used herein for ease of explanation to describe one element or feature’s relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as “below” or “beneath” or “under” other elements or features would then be oriented “above” the other elements or features. Thus, the example terms “below” and “under” may encompass both an orientation of above and below. The device may be otherwise oriented, for example, rotated 90 degrees or at other orientations, and the spatially relative descriptors used herein should be interpreted accordingly.

Figure 2:
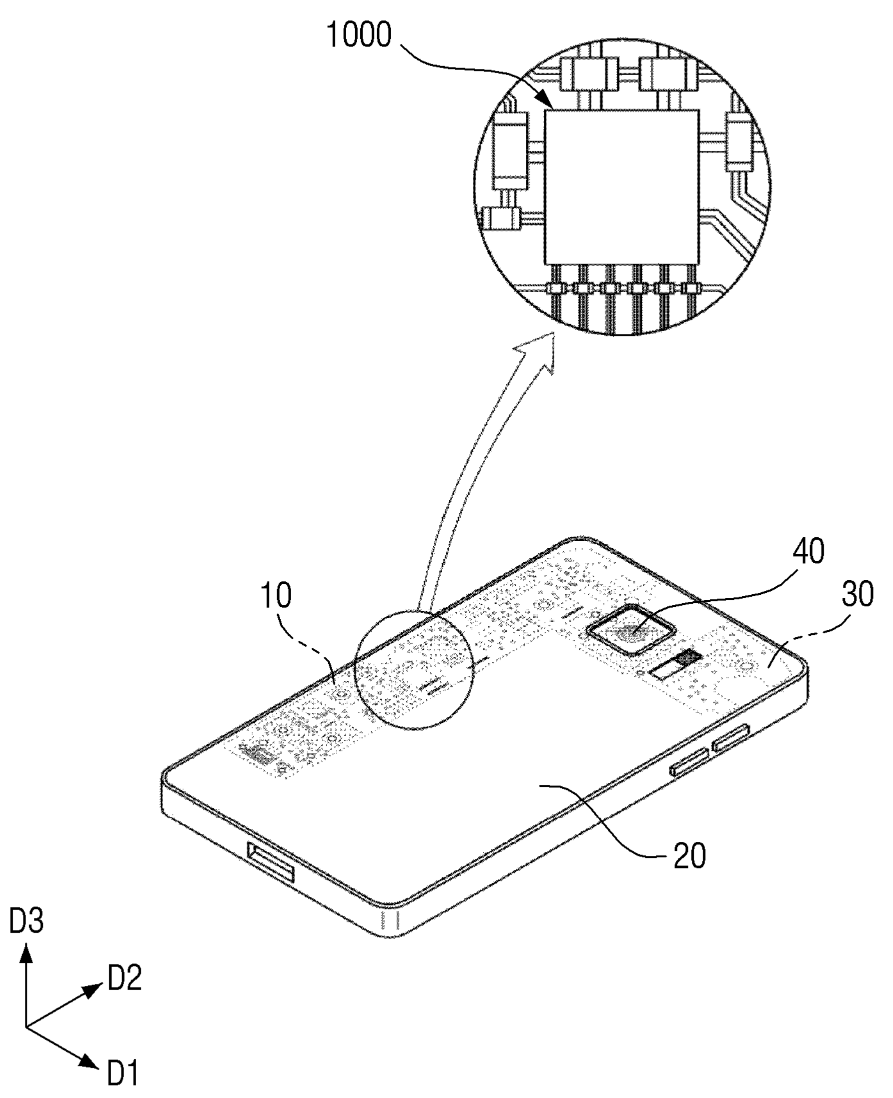
FIG. 2 is a diagram illustrating an electronic device according to some embodiments.

FIG. 1 is a diagram illustrating an electronic device according to some embodiments. FIG. 2 is a diagram illustrating an electronic device according to some embodiments.

Referring to FIG. 1, an electronic device 1 may include a host 10, an interface 11, and a semiconductor package 1000.

In some embodiments, the host 10 may be connected to the semiconductor package 1000 via the interface 11. For example, the host 10 may transmit a signal to the semiconductor package 1000 to control the semiconductor package 1000. Further, for example, the host 10 may receive a signal from the semiconductor package 1000 and process data included in the received signal.

For example, the host 10 may include a central processing unit (CPU), a controller, an ASIC (Application Specific Integrated Circuit), or the like. Further, for example, the host 10 may include a memory chip such as DRAM (Dynamic Random Access Memory), SRAM (Static RAM), PRAM (Phase-change RAM), MRAM (Magneto resistive RAM), FeRAM (Ferroelectric RAM) and RRAM (Resistive RAM).

Referring to FIG. 1 and FIG. 2, the electronic device 1 may include the host 10, a body 20, a main board 30, a camera module 40, and the semiconductor package 1000.

The main board 30 may be mounted in the body 20 of the electronic device 1. The host 10, the camera module 40, and the semiconductor package 1000 may be mounted on the main board 30. The host 10, the camera module 40, and the semiconductor package 1000 may be electrically connected with each other via the main board 30. For example, the interface 11 may be implemented by the main board 30.

The host 10 and the semiconductor package 1000 may be electrically connected with each other via the main board 30 and may transmit and receive a signal therebetween via the main board.

Hereinafter, a semiconductor package according to some embodiments will be described with reference to FIG. 3 to FIG. 6.

Figure 3:
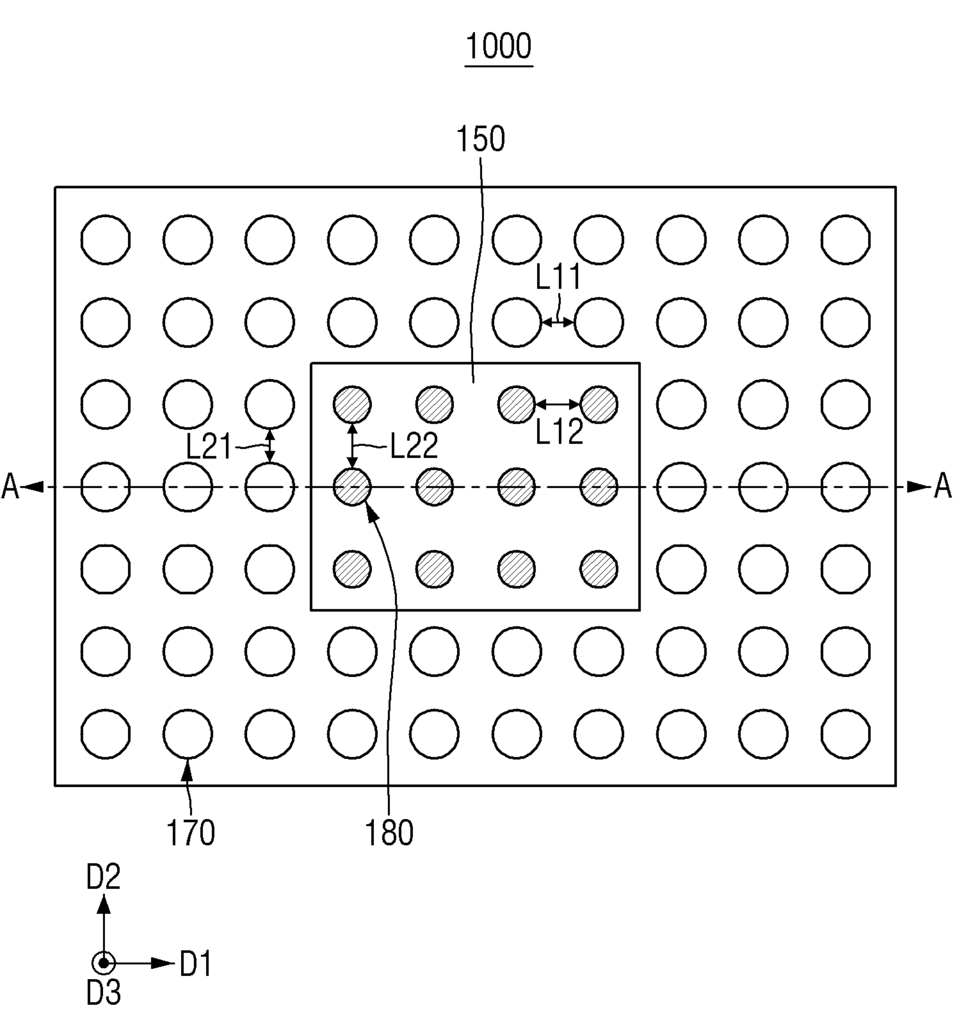
FIG. 3 is an illustrative layout diagram of a semiconductor package according to some embodiments.
Figure 4:
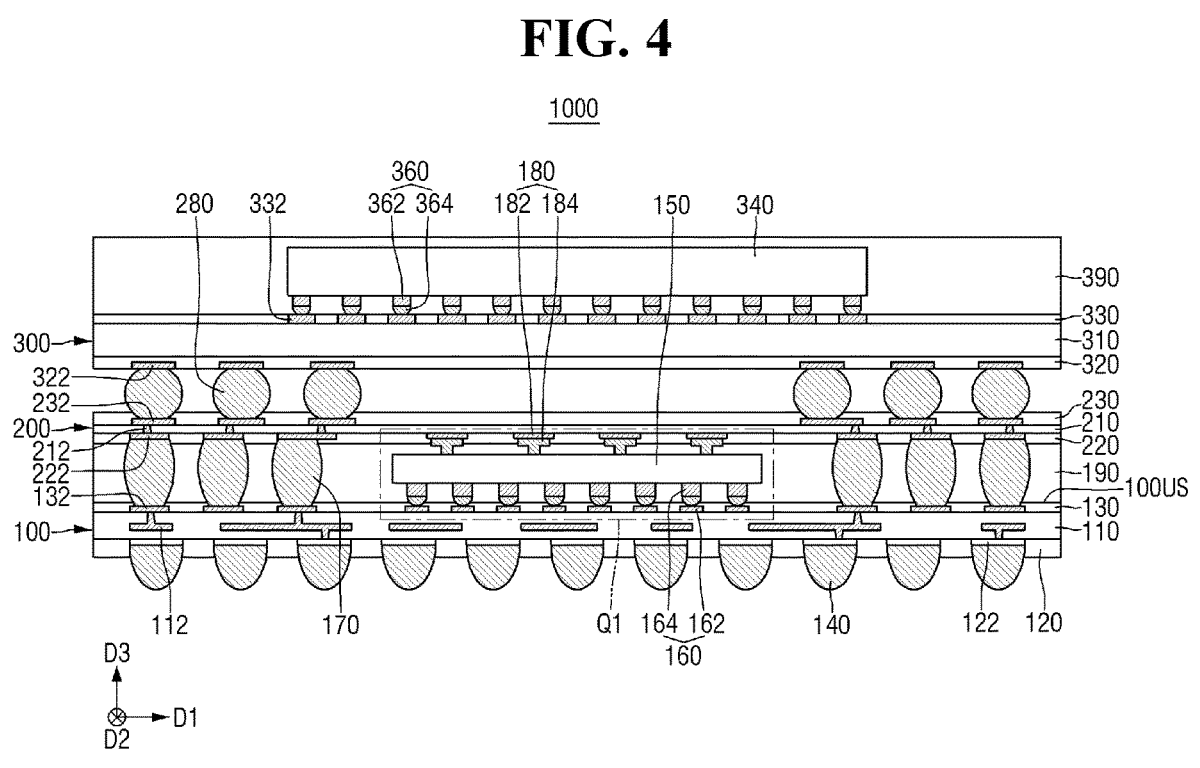
Figure 5:
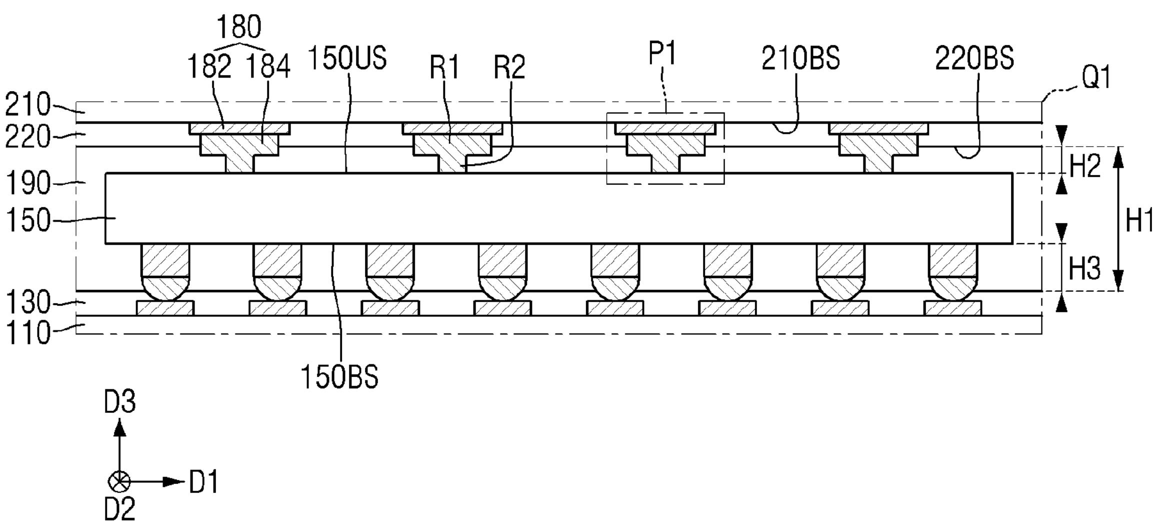
FIG. 5 is an enlarged view to illustrate a Q1 area of FIG. 4.
Figure 6:
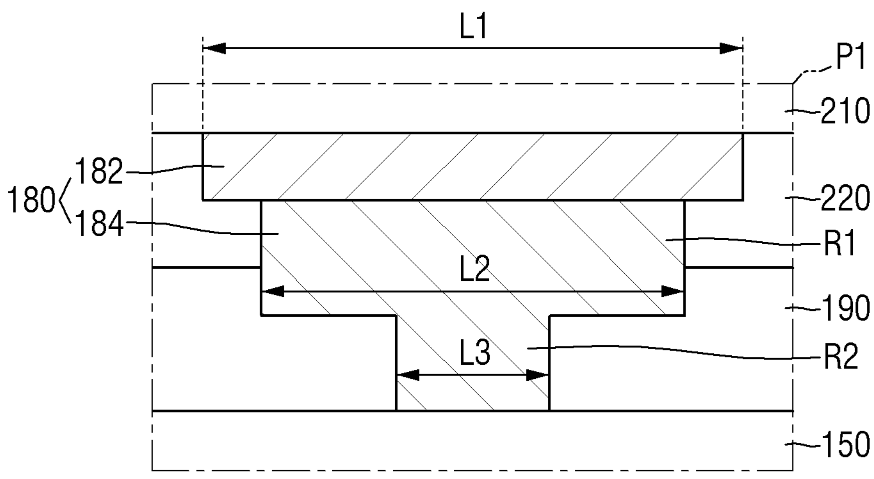
FIG. 6 is an enlarged view to illustrate a P1 area of FIG. 5

FIG. 3 is an illustrative layout diagram of a semiconductor package according to some embodiments. FIG. 4 is a cross-sectional view illustrating a semiconductor package according to one embodiment. FIG. 5 is an enlarged view to illustrate a Q1 area of FIG. 4. FIG. 6 is an enlarged view to illustrate a P1 area of FIG. 5. FIG. 4 is a cross-sectional view taken along A-A of FIG. 3.

Referring to FIG. 3 to FIG. 6, the semiconductor package according to some embodiments includes a first substrate 100, a first semiconductor chip 150, an interposer 200, a first connection member 170, a support member 180, a second substrate 300, a second semiconductor chip 340, and a second connection member 280.

The first substrate 100 may be a substrate for a package. For example, the first substrate 100 may be embodied as a printed circuit board (PCB) or a ceramic substrate. Alternatively, the first substrate 100 may be a substrate for a wafer-level package (WLP) manufactured at a wafer level. The first substrate 100 may include a bottom surface and an upper surface 100US opposite to each other.

The first substrate 100 may include a first insulating layer 110, a first conductive pattern 112, a first lower passivation film 120, a first lower pad 122, a first upper passivation film 130, and a first upper pad 132.

The first insulating layer 110 and the first conductive pattern 112 in the first insulating layer 110 may constitute a wiring pattern for electrically connecting the first lower pad 122 and the first upper pad 132 with each other. The first insulating layer 110 is illustrated as being embodied as a single layer. However, the present disclosure is not limited thereto. For example, the first insulating layer 110 may be embodied as multiple layers while the first conductive pattern 112 may be embodied as multiple layers corresponding to the multiple layers of the first insulating layer 110.

The first lower passivation film 120 and the first lower pad 122 may be formed on a bottom surface of the first insulating layer 110. The first lower pad 122 may be electrically connected to the first conductive pattern 112. The first lower passivation film 120 may cover a bottom surface of the first insulating layer 110 and expose the first lower pad 122. In some embodiments, the first lower pad 122 may be exposed by an opening of the first lower passivation film 120, and a third connection member 140 may contact the first lower pad 122 via the opening of the first lower passivation film 120. A vertical level of a bottom surface of the first lower passivation film 120 may be lower than a vertical level of a bottom surface of the first lower pad 122.

In some embodiments, the third connection member 140 may be formed on a bottom surface of the first substrate 100. The third connection member 140 may be attached to the first lower pad 122. The third connection member 140 may have, for example, a semi-circular spherical shape or a semi-elliptical spherical shape. In some embodiments, the third connection member 140 may include or may be a solder ball. However, the present disclosure is not limited thereto. The third connection member 140 may include or may be formed of, for example, at least one of tin (Sn), indium (In), bismuth (Bi), antimony (Sb), copper (Cu), silver (Ag), zinc (Zn), lead (Pb), and a combination thereof. However, the present disclosure is not limited thereto.

The third connection member 140 may electrically connect the first substrate 100 to an external device. Accordingly, the third connection member 140 may provide an electrical signal to the first substrate 100 or an electrical signal provided from the first substrate 100 to the external device.

The first upper passivation film 130 and the first upper pad 132 may be formed on an upper surface of the first insulating layer 110. The first upper passivation film 130 may cover the upper surface of the first insulating layer 110 and expose the first upper pad 132. In some embodiment, the first upper pad 132 may be exposed by an opening of the first upper passivation film 130, and the first connection member 170 may contact the first upper pad 132 via the opening of the first upper passivation film 130.

Each of the first lower passivation film 120 and the first upper passivation film 130 may include or may be formed of, for example, a photosensitive insulating material (PID: photoimageable dielectric). However, the present disclosure is not limited thereto.

The first semiconductor chip 150 may be disposed on the upper surface 100US of the first substrate 100. For example, the first semiconductor chip 150 may be mounted on the upper surface 100US of the first substrate 100. The first semiconductor chip 150 may be embodied as an integrated circuit (IC) in which hundreds to millions of semiconductor devices are integrated into one chip. For example, the first semiconductor chip 150 may be embodied as an application processor (AP) such as CPU (Central Processing Unit), GPU (Graphic Processing Unit), FPGA (Field-Programmable Gate Array), a digital signal processor, an encryption processor, a microprocessor, and a microcontroller. However, the present disclosure is not limited thereto. For example, the first semiconductor chip 150 may be embodied as a logic chip such as an ADC (Analog-Digital Converter) and an ASIC (Application-Specific IC), or may be embodied as a memory chip such as a volatile memory (such as DRAM) and a non-volatile memory (such as ROM or flash memory). Further, in another example, the first semiconductor chip 150 may be embodied as a combination thereof.

It is illustrated that only one first semiconductor chip 150 is formed on the first substrate 100. However, this is intended only for convenience of illustration. For example, a plurality of first semiconductor chip 150 may be formed side by side on the first substrate 100, or a plurality of first semiconductor chips 150 may be sequentially stacked on the first substrate 100.

In some embodiments, the first semiconductor chip 150 may be mounted on the first substrate 100 using a flip chip bonding scheme. For example, a first bump 160 may be formed between the upper surface 100US of the first substrate 100 and a bottom surface 150B S of the first semiconductor chip 150. The first bump 160 may electrically connect the first substrate 100 and the first semiconductor chip 150 with each other.

The first bump 160 may include, for example, a first pillar layer 164 and a first solder layer 162.

The first pillar layer 164 may protrude from a bottom surface of the first semiconductor chip 150. The first pillar layer 164 may include or may be formed of, for example, at least one of copper (Cu), copper alloy, nickel (Ni), nickel alloy, palladium (Pd), platinum (Pt), gold (Au), cobalt (Co), and a combination thereof. However, the present disclosure is not limited thereto.

The first solder layer 162 may connect the first pillar layer 164 and the first substrate 100 with each other. For example, each of the first solder layers 162 may be connected to each of some of the first upper pads 132. The first solder layer 162 may have, for example, a semi-circular spherical shape or a semi-elliptical spherical shape. However, the present disclosure is not limited thereto. The first solder layer 162 may include or may be formed of, for example, at least one of tin (Sn), indium (In), bismuth (Bi), antimony (Sb), copper (Cu), silver (Ag), zinc (Zn), lead (Pb), and a combination thereof. However, the present disclosure is not limited thereto.

The interposer 200 may be interposed between the first substrate 100 and the second substrate 300. For example, the interposer 200 may be disposed on the upper surface of the first substrate 100. In some embodiments, the interposer 200 may be disposed on an upper surface 150US of the first semiconductor chip 150. The interposer 200 may facilitate connection between the first substrate 100 and the second substrate 300. Further, interposer 200 may prevent warpage of the first substrate 100 and the second substrate 300.

The interposer 200 may include bottom and upper surfaces opposite to each other. For example, the bottom surface of the interposer 200 may face the upper surface 100US of the first substrate 100, and the upper surface of the interposer 200 may face a bottom surface of the second substrate 300.

In some embodiments, the interposer 200 may be spaced apart from the first substrate 100. In some embodiments, a spacing H1 from the upper surface 100US of the first substrate 100 to a bottom surface 220BS of the second lower passivation film 220 may be selected from a range of about 120 μm to about 200 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In some embodiments, the interposer 200 may be spaced apart from the first semiconductor chip 150. In some embodiments, a spacing H2 from the upper surface 150US of the first semiconductor chip 150 to the bottom surface 220B S of the second lower passivation film 220 may be selected from a range of about 15 μm to about 45 μm.

In some embodiments, a spacing H3 from the upper surface 100US of the first substrate 100 to the bottom surface 150B S of the first semiconductor chip 150 may be selected from a range of about 15 μm to about 45 μm.

In some embodiments, the spacing H2 from the upper surface 150US of the first semiconductor chip 150 to the bottom surface 220B S of the second lower passivation film 220 may be equal or smaller than a spacing from the upper surface of the first substrate 100 to the bottom surface 150B S of the first semiconductor chip 150.

The interposer 200 may include a second insulating layer 210, a second conductive pattern 212, a second lower passivation film 220, a second lower pad 222, a second upper passivation film 230, and a third upper pad 232.

A thickness of the interposer 200 may be selected from a range of about 100 μm to about 220 μm. In this regard, the thickness may be a distance in a third direction D3 from a bottom surface of the second lower passivation film 220 to an upper surface of the second upper passivation film 230. As the thickness of the interposer 200 becomes smaller, warpage may occur at the center of the interposer 200.

The second insulating layer 210 and the second conductive pattern 212 in the second insulating layer 210 may constitute a wiring pattern for electrically connecting the second lower pad 222 and the third upper pad 232 with each other. The second insulating layer 210 is illustrated as being embodied as a single layer. However, this is intended only for convenience of illustration. For example, in another example, the second insulating layer 210 is embodied as multiple layers while the second conductive pattern 212 is embodied as multiple layers corresponding to the multiple layers of the second insulating layer 210.

The second lower passivation film 220 and the second lower pad 222 may be formed on a bottom surface of the second insulating layer 210. The second lower passivation film 220 may cover the bottom surface of the second insulating layer 210 and expose the second lower pad 222. In some embodiments, the second lower pad 222 may be exposed by an opening of the second lower passivation film 220, and the first connection member 170 may contact the second lower pad 222 via the opening of the second lower passivation film 220.

The second upper passivation film 230 and the third upper pad 232 may be formed on an upper surface of the second insulating layer 210. The third upper pad 232 may be electrically connected to the second conductive pattern 212. The second upper passivation film 230 may cover the upper surface of the second insulating layer 210 and expose the third upper pad 232. In some embodiments, the third upper pad 232 may be exposed by an opening of the second upper passivation film 230, and the second connection member 280 may contact the third upper pad 232 via the opening of the second upper passivation film 230.

Each of the second lower passivation film 220 and the second upper passivation film 230 may include or may be formed of, for example, a photosensitive insulating material (PID: photoimageable dielectric). However, the present disclosure is not limited thereto.

The first connection member 170 may be interposed between the first substrate 100 and the interposer 200. The first connection member 170 may contact the upper surface of the first substrate 100 and the bottom surface of the interposer 200. The first connection member 170 may electrically connect the first substrate 100 and the interposer 200 with each other. For example, the first connection member 170 may contact the first upper pad 132 of the first substrate 100 and the second lower pad 222 of the interposer 200. Accordingly, the first connection member 170 may electrically connect the first conductive pattern 112 and the second conductive pattern 212 with each other.

A vertical dimension of the first connection member 170 may be smaller than the spacing H1 from the upper surface of the first substrate 100 to the bottom surface of the interposer 200. However, the present disclosure is not limited thereto. For example, the vertical dimension of the first connection member 170 may be equal to the spacing H1 from the upper surface of the first substrate 100 to the bottom surface of the interposer 200. In this regard, the vertical dimension means a maximum length in a vertical direction perpendicular to the upper surface of the first substrate 100.

In some embodiments, a width of the first connection member 170 may be selected from a range of about 120 μm to about 200 μm. In this regard, the width means a maximum length in a horizontal direction parallel to the upper surface of the first substrate 100.

The first connection member 170 may be, for example, a circular spherical shape or an elliptical spherical shape. However, the present disclosure is not limited thereto. The first connection member 170 may include or may be formed of, for example, at least one of tin (Sn), indium (In), bismuth (Bi), antimony (Sb), copper (Cu), silver (Ag), zinc (Zn), lead (Pb), and a combination thereof. However, the present disclosure is not limited thereto.

Referring back to FIG. 4 to FIG. 6, the support member 180 may include a third lower pad 182 and a second bump 184.

The support member 180 may be disposed between the interposer 200 and the first semiconductor chip 150. The support member 180 may be disposed on the upper surface 150US of the first semiconductor chip 150. The support member 180 may contact the upper surface 150US of the first semiconductor chip 150 and support the interposer 200 in the third direction D3 in an area where the first semiconductor chip 150 overlaps the interposer 200. The support member 180 may support the interposer 200 so as to maintain a specific spacing (for example, H1 or H2) between the interposer 200 and the first substrate 100 or the first semiconductor chip 150 in a process of bonding the interposer 200 onto the first substrate 100.

The third lower pad 182 may be disposed on the bottom surface of the second insulating layer 210. The second lower passivation film 220 may cover the bottom surface of the second insulating layer 210 and expose the third lower pad 182. The third lower pad 182 and the second lower pad 222 may be positioned at the same vertical level. As used herein, a phrase "A and B are positioned at the same vertical level" may mean that A and B are formed in the same manufacturing process. However, the present invention is not limited thereto.

The second bump 184 may be disposed under the third lower pad 182. The second bump 184 may be formed using wire bonding equipment. The second bump 184 may include or may be formed of, but is not limited to, one of copper (Cu), copper alloy, nickel (Ni), nickel alloy, palladium (Pd), platinum (Pt), gold (Au), and cobalt (Co).

The second bump 184 may contact the upper surface of the first semiconductor chip 150. Heat generated from the first semiconductor chip 150 may be discharged to the second bump 184. The second bump 184 may discharge the heat transferred from the first semiconductor chip 150 to the interposer 200 and the second substrate 300.

The second bump 184 may include a first area R1 and a second area R2. The first area R1 may be an upper area of the second bump 184. In some embodiments, the second bump 184 may include a first end having the first area R1 and a second end having the second area R2. The first area R1 may be an area in contact with the third lower pad 182. In some embodiment, the first end of the second bump 184 may contact the third lower pad 182. The second area R2 may be disposed below the first area R1 and thus may be a lower area of the second bump. For example, the first end may be disposed between the second end and the interposer 200. The first area R1 and the second area R2 of the second bump 184 may be formed in the same manufacturing process. The term "contact," as used herein, refers to a direct connection (i.e., touching) unless the context indicates otherwise.

The third lower pad 182 may have a first width L1 in the first direction D1. The first area R1 may have a second width L2 in the first direction D1. The second area R2 may have a third width L3 in the first direction D1. In this regard, the second width L2 and the third width L3 may mean the largest width in the first direction D1 of the first area R1 and the second area R2, respectively. The second width L2 may be smaller than the first width L1. The third width L3 may be smaller than the second width L2. In other words, the width in the first direction D1 of the second bump 184 may decrease as the second bump 184 extends from the first area R1 to the second area R2.

The first area R1 may protrude upwardly beyond an upper surface of the first molding film 190 into the second lower passivation film 220. That is, a vertical dimension between a portion of the first area R1 and the second insulating layer 210 may be larger than a vertical dimension between the bottom surface 220BS of the second lower passivation film 220 and the second insulating layer 210. However, the technical idea of the present disclosure is not limited thereto. In some embodiments, the first area R1 may be coplanar with the bottom surface 220BS of the second lower passivation film 220.

Referring back to FIGS. 3 and 4, each of the first connection member 170 and the support member 180 may include a plurality of members disposed between the first substrate 100 and the interposer 200. The plurality of first connection members 170 may be arranged in the first direction D1 and the second direction D2. The plurality of support members 180 may be arranged in the first direction D1 and the second direction D2. In some embodiments, a spacing L11 by which adjacent ones of the plurality of first connection members 170 are spaced apart from each other in the first direction D1 may be smaller than a spacing L12 by which adjacent ones of the plurality of support members 180 are spaced apart from each other in the first direction D1. Further, a spacing L21 by which adjacent ones of the plurality of first connection members 170 are spaced apart from each other in the second direction D2 may be smaller than a spacing L22 by which adjacent ones of the plurality of support members 180 are spaced apart from each other in the second direction D2. However, the technical idea of the present disclosure is not limited thereto. For example, the spacings L11 and L21 between the first connection members 170 may be respectively equal to the spacings L12 and L22 between the support members 180.

In some embodiments, the support member 180 may include a plurality of members arranged along at least one side of the first semiconductor chip 150. The support member 180 may be disposed on the upper surface 150US of the semiconductor chip 150. To the contrary, the first connection member 170 may not be disposed on the upper surface 150US of the semiconductor chip 150. The first connection members 170 may be arranged around the semiconductor chip 150.

Referring back to FIG. 4, in some embodiments, a first molding film 190 may be formed on the first substrate 100. The first molding film 190 may fill an area between the first substrate 100 and the interposer 200. Accordingly, the first molding film 190 may cover and protect the first substrate 100, the first semiconductor chip 150, the first bump 160, the first connection member 170, and the support member 180. The first connection member 170 and the support member 180 may extend through the first molding film 190 so as to electrically connect the first substrate 100 and the interposer 200 with each other.

The first molding film 190 may include, for example, an insulating polymer material such as an EMC (epoxy molding compound). However, the present disclosure is not limited thereto.

Although not shown, in some embodiments, an underfill may be formed on the first substrate 100. The underfill may fill an area between the first substrate 100 and the first semiconductor chip 150. The underfill may cover the first semiconductor chip 150. The underfill may fix the first semiconductor chip 150 onto the first substrate 100 to prevent the first semiconductor chip 150 from being damaged. The underfill may cover the first bump 160. The first bump 160 may extend through the underfill so as to electrically connect the first substrate 100 and the first semiconductor chip 150 with each other.

The underfill may include or may be formed of, for example, an insulating polymer material such as EMC. However, the present disclosure is not limited thereto. In some embodiments, the underfill may include or may be formed of a material different from a material of the first molding film 190. For example, the underfill may include or may be formed of an insulating material having fluidity superior to fluidity of the first molding film 190. Accordingly, the underfill may efficiently fill a narrow space between the first substrate 100 and the first semiconductor chip 150.

The second substrate 300 may be disposed on the upper surface of the interposer 200. The second substrate 300 may be a substrate for a package. For example, the second substrate 300 may be embodied as a printed circuit board (PCB) or a ceramic substrate. Alternatively, the second substrate 300 may be a substrate for a wafer level package (WLP) manufactured at wafer level.

The second substrate 300 may include bottom and upper surfaces opposite to each other. For example, the bottom surface of the second substrate 300 may face the upper surface of the interposer 200.

The second substrate 300 may include a third insulating layer 310, a third lower passivation film 320, a fourth lower pad 322, a third upper passivation film 330, and a fourth upper pad 332.

The third insulating layer 310 and a conductive pattern (not shown) in the third insulating layer 310 may constitute a wiring pattern for electrically connecting the fourth lower pad 322 and the fourth upper pad 332 with each other. The third insulating layer 310 is illustrated as being embodied as a single layer. However, this is intended only for convenience of illustration. For example, in another example, the third insulating layer 310 is embodied as multiple layers while the conductive pattern in the third insulating layer 310 is embodied as multiple layers corresponding to the multiple layers in the third insulating layer 310.

The third lower passivation film 320 and the fourth lower pad 322 may be formed on a bottom surface of the third insulating layer 310. The third lower passivation film 320 may cover the bottom surface of the third insulating layer 310 and expose the fourth lower pad 322. In some embodiments, the fourth lower pad 322 may be exposed by an opening of the third lower passivation film 320, and the second connection member 280 may contact the fourth lower pad 322 via the opening of the third lower passivation film 320.

The third upper passivation film 330 and the fourth upper pad 332 may be formed on an upper surface of the third insulating layer 310. The third upper passivation film 330 may cover the upper surface of the third insulating layer 310 and expose the fourth upper pad 332. In some embodiments, the fourth upper pad 332 may be exposed by an opening of the third upper passivation film 330, and a second solder layer 364 of a third bump 360 may contact the fourth upper pad 332 via the opening of the third upper passivation film 330.

Each of the third lower passivation film 320 and the third upper passivation film 330 may include or may be formed of, for example, a photosensitive insulating material (PID: photoimageable dielectric). However, the present disclosure is not limited thereto.

The second connection member 280 may be interposed between the interposer 200 and the second substrate 300. The second connection member 280 may be in contact with the upper surface of the interposer 200 and the bottom surface of the second substrate 300. The second connection member 280 may electrically connect the interposer 200 and the second substrate 300 with each other. For example, the second connection member 280 may contact the third upper pad 232 of the interposer 200 and the fourth lower pad 322 of the second substrate 300.

The second connection member 280 may have, for example, a circular spherical shape or an elliptical spherical shape. However, the present disclosure is not limited thereto. The second connection member 280 may include or may be formed of, for example, at least one of tin (Sn), indium (In), bismuth (Bi), antimony (Sb), copper (Cu), silver (Ag), zinc (Zn), lead (Pb), and a combination thereof. However, the present disclosure is not limited thereto.

The second semiconductor chip 340 may be disposed on the second substrate 300. For example, the second semiconductor chip 340 may be mounted on the upper surface of the second substrate 300. The second semiconductor chip 340 may be embodied as an integrated circuit (IC) in which hundreds to millions of semiconductor devices are integrated into one chip.

In some embodiments, the first semiconductor chip 150 may be embodied as a logic chip such as an application processor (AP), while the second semiconductor chip 340 may be embodied as a memory chip such as volatile memory (for example, DRAM) and a non-volatile memory (for example, ROM or flash memory).

It is illustrated that only one second semiconductor chip 340 is formed on the second substrate 300. However, this is intended only for convenience of illustration. For example, a plurality of second semiconductor chips 340 may be disposed on the second substrate 300 and may be arranged side by side. Alternatively, the plurality of second semiconductor chips 340 may be sequentially stacked on the second substrate 300.

In some embodiments, the second semiconductor chip 340 may be mounted onto the second substrate 300 using a flip chip bonding scheme. For example, the third bump 360 may be formed between the upper surface of the second substrate 300 and a bottom surface of the second semiconductor chip 340. The third bump 360 may electrically connect the second substrate 300 and the second semiconductor chip 340 with each other.

The third bump 360 may include, for example, a second pillar layer 362 and the second solder layer 364. Since the second pillar layer 362 and the second solder layer 364 may be respectively similar to the first pillar layer 164 and the first solder layer 162 as described above, detailed descriptions thereof will be omitted below.

In some embodiments, a second molding film 390 may be formed on the second substrate 300. The second molding film 390 may cover and protect the second substrate 300, the second semiconductor chip 340 and the third bump 360. The second molding film 390 may include or may be formed of, for example, an insulating polymer material such as EMC. However, the present disclosure is not limited thereto.

Figure 7:
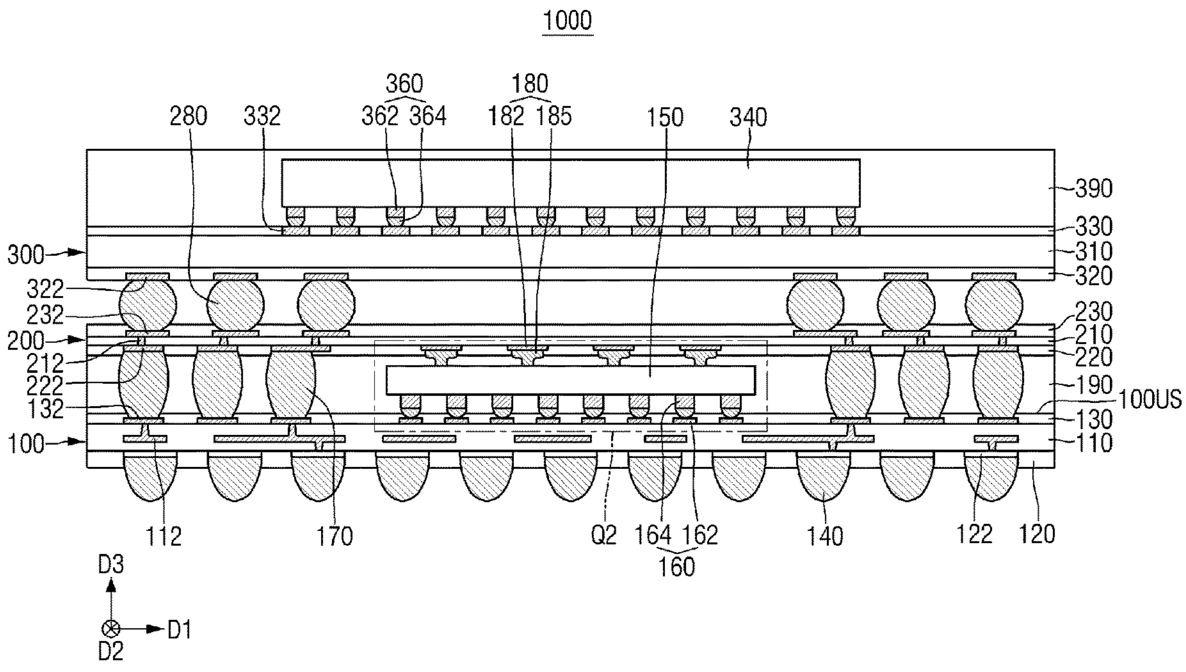
FIG. 7 is a cross-sectional view illustrating a semiconductor package according to an embodiment.
Figure 8:
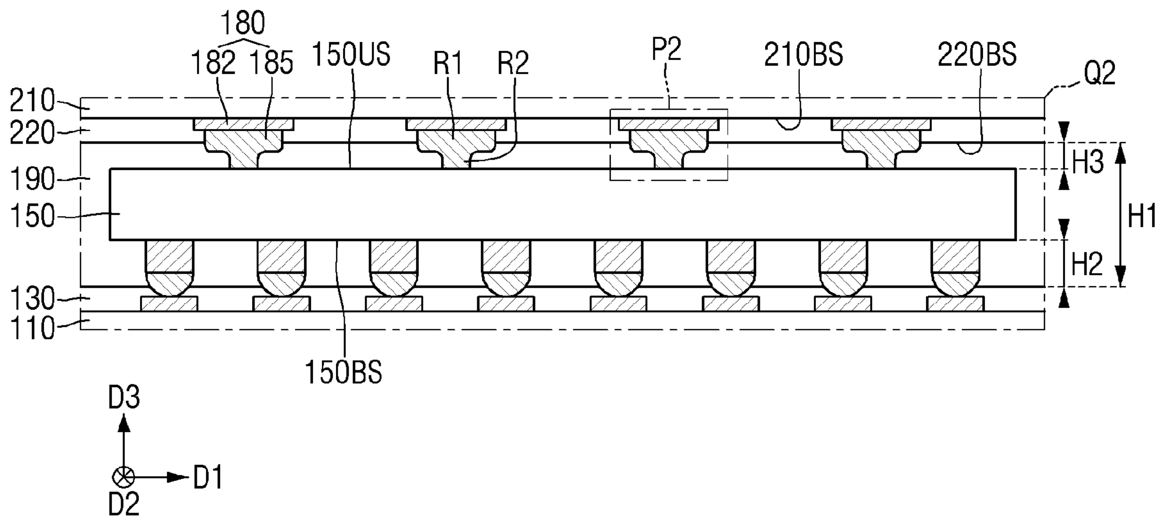
FIG. 8 is an enlarged view to illustrate a Q2 area of FIG. 7.
Figure 9:
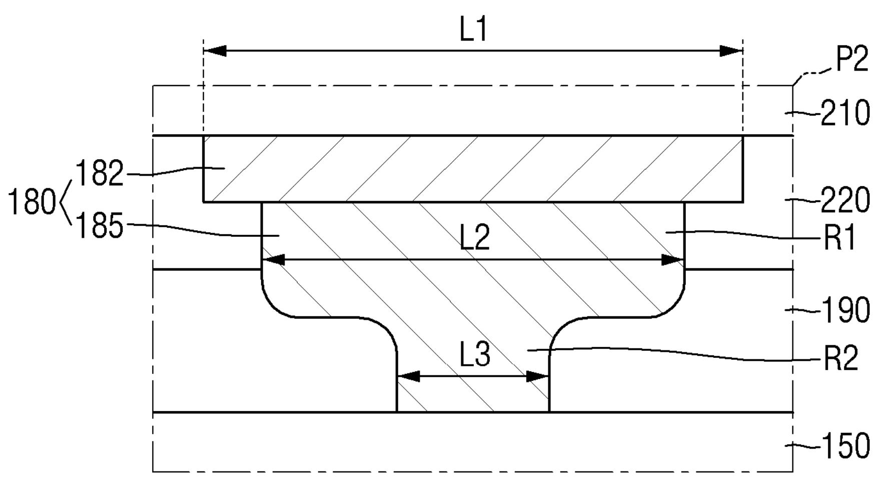
FIG. 9 is an enlarged view to illustrate a P2 area of FIG. 8

FIG. 7 is a cross-sectional view illustrating a semiconductor package according to an embodiment. FIG. 8 is an enlarged view to illustrate a Q2 area of FIG. 7. FIG. 9 is an enlarged view to illustrate a P2 area of FIG. 8. For convenience of description, following descriptions are based on differences from those as set forth with reference to FIG. 3 to FIG. 6.

Referring to FIG. 7 to FIG. 9, the support member 180 may include the third lower pad 182 and a second bump 185.

The third lower pad 182 may be disposed on the bottom surface 210BS of the second insulating layer 210. The second lower passivation film 220 may cover the bottom surface of the second insulating layer 210 and expose the third lower pad 182. The third lower pad 182 and the second lower pad 222 may be positioned at the same vertical level. The second bump 185 may be disposed under the third lower pad 182. The second bump 185 may include a first end having a first area R1 and a second end having a second area R2. The first area R1 may be an upper area of the second bump 185. The second area R2 may be disposed below the first area R.

The third lower pad 182 may have a first width L1 in the first direction D1. The first area R1 may have a second width L2 in the first direction D1. The second area R2 may have a third width L3 in the first direction D1. The second width L2 may be smaller than the first width L1. The third width L3 may be smaller than the second width L2. In other words, the width in the first direction D1 of the second bump 185 may decrease as the second bump 185 extends from the first area R1 to the second area R2.

In a cross-sectional view, a lower portion of the first area R1 may have a rounded corner. A portion of the first area R1 contacting the first molding film 190 may have a curved face. A boundary portion of the first area R1 and the second area R2 may have a curved face. In other words, a shape of the second bump 185 in each of the first area R1 and the second area R2 may be a curved line or a combination of a straight line and a curved line. A width in the first direction D1 of the first area R1 at a portion thereof adjacent to the second area R2 may be smaller than the second width L2. A width in the second direction D2 of the second area R2 at a portion thereof adjacent to the first area R1 may be larger than the third width L3.

Figure 10:
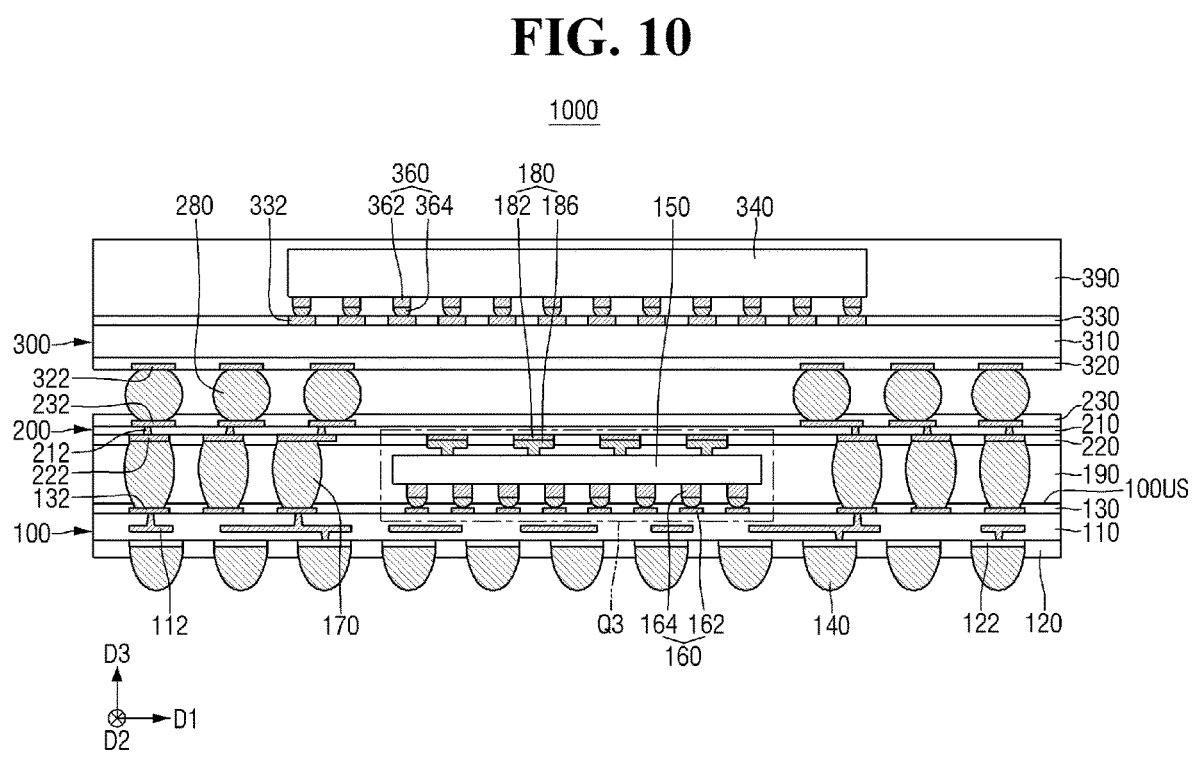
Figure 11:
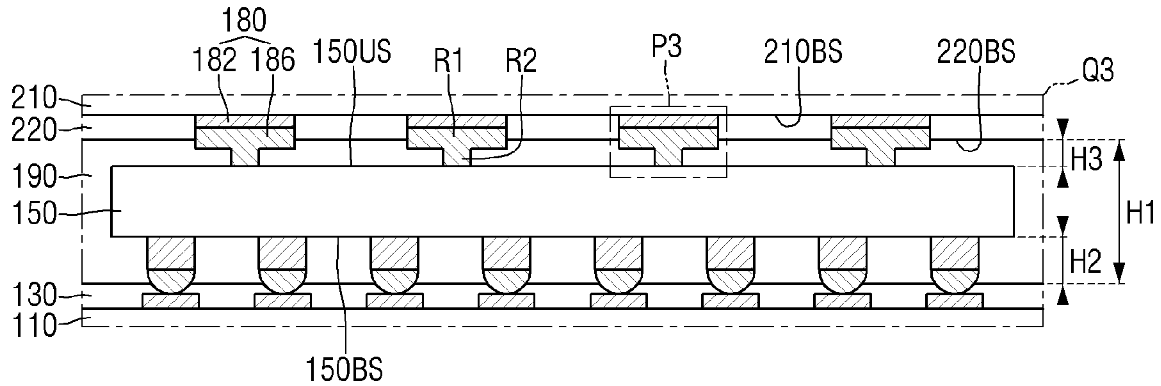
FIG. 11 is an enlarged view to illustrate a Q3 area of FIG. 10.
Figure 12:
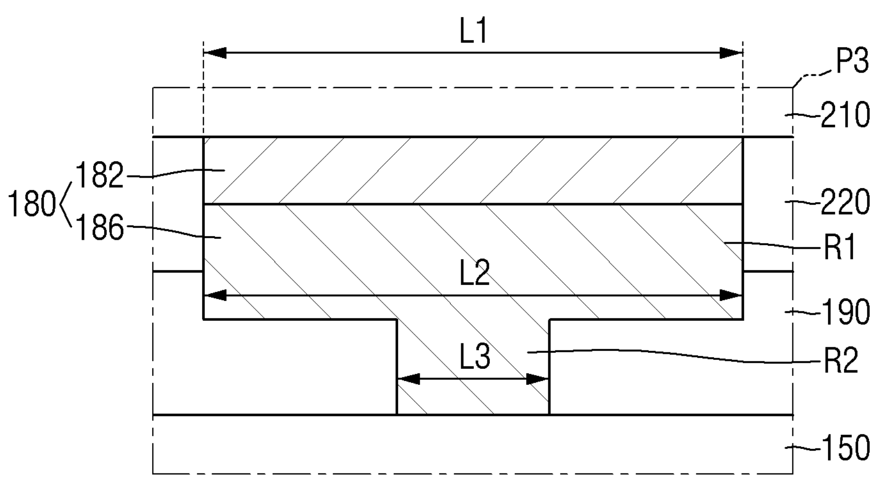
FIG. 12 is an enlarged view to illustrate a P3 area of FIG. 11.

FIG. 10 is a cross-sectional view illustrating a semiconductor package according to an embodiment. FIG. 11 is an enlarged view to illustrate a Q3 area of FIG. 10. FIG. 12 is an enlarged view to illustrate a P3 area of FIG. 11. For convenience of description, following descriptions are based on differences from those as set forth with reference to FIG. 3 to FIG. 6.

Referring to FIG. 10 to FIG. 12, the support member 180 may include the third lower pad 182 and a second bump 186. The second bump 186 may include a first end having a first area R1 and a second end having a second area R2. The first area R1 may be an upper area of the second bump 186. The second area R2 may be disposed below the first area R1.

The third lower pad 182 may have a first width L1 in the first direction D1. The first area R1 may have a second width L2 in the first direction D1. The second area R2 may have a third width L3 in the first direction D1. The second width L2 may be equal to the first width L1. The third width L3 may be smaller than the second width L2. In some embodiments, the first area R1 and the second area R2 may have rounded corners. These may be similar to the shapes of the first area R1 and the second area R2 in FIG. 9.

Figure 13:
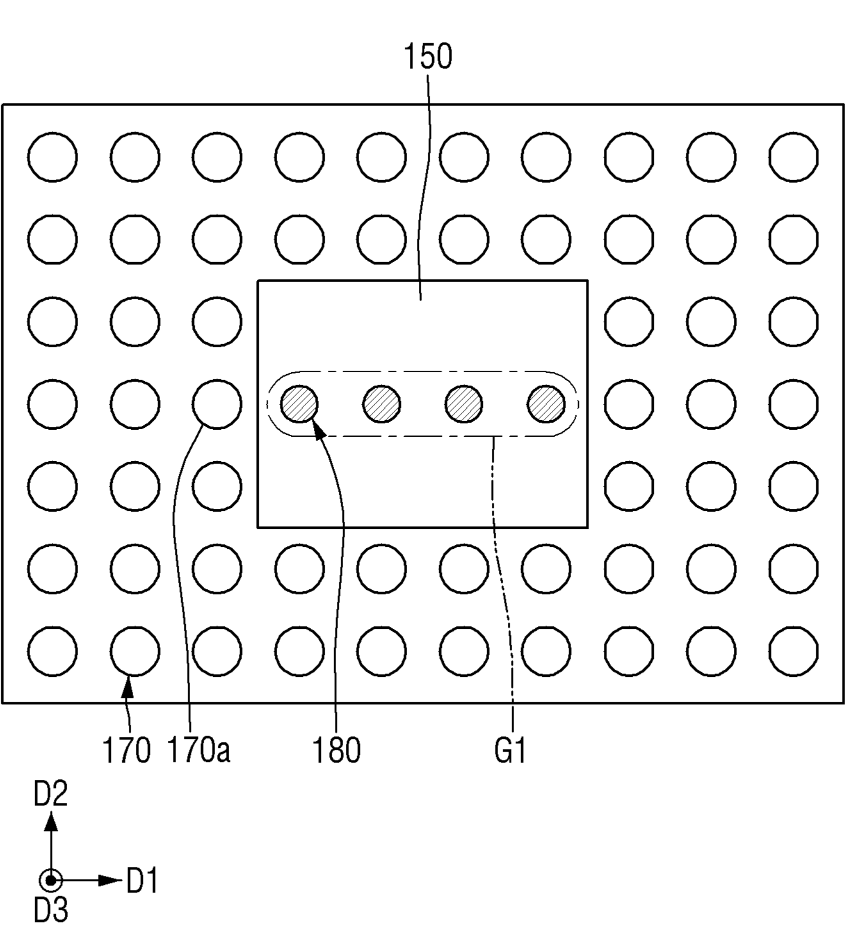
FIG. 13 and FIG. 14 are respective layout diagrams illustrating a semiconductor package according to an embodiment.
Figure 14:
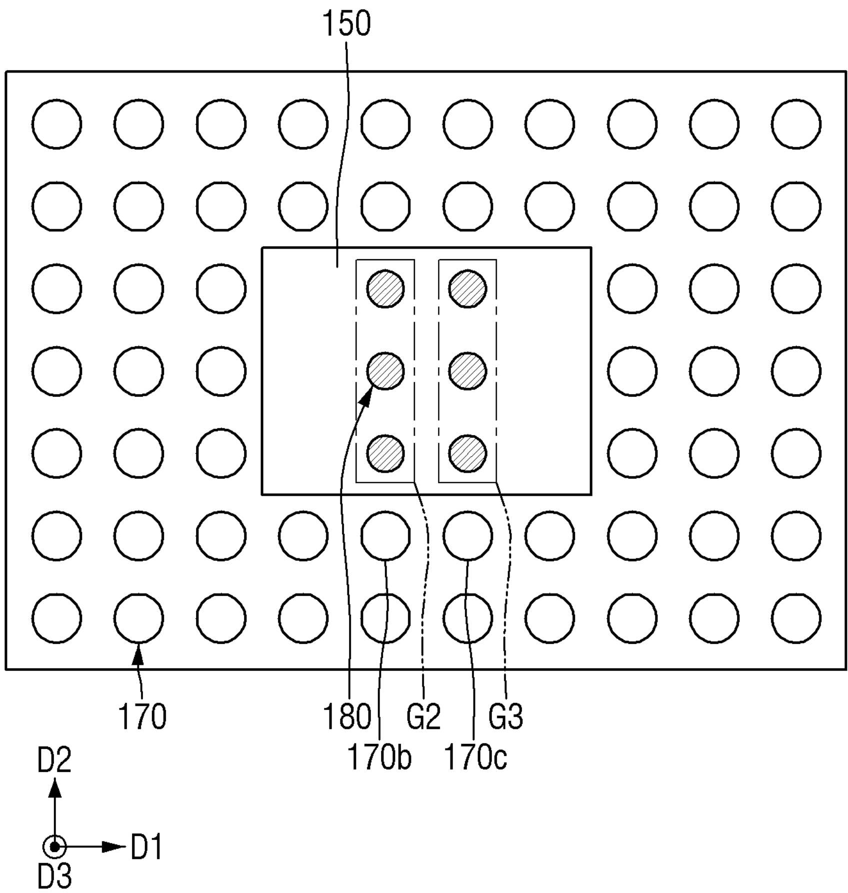

FIG. 13 and FIG. 14 are respective layout diagrams illustrating a semiconductor package according to an embodiment.

Referring to FIG. 13, in the semiconductor package according to some embodiments, a plurality of support members 180 may constitute a first group G1. The first group G1 may include the plurality of support members 180 arranged in the first direction D1. The plurality of first connection members 170 may be arranged in the first direction D1 and the second direction D2. The first connection members 170 may be arranged around the first semiconductor chip 150. The plurality of support members 180 of the first group G1 may be aligned with the first connection members 170 disposed on one side of the first semiconductor chip 150 and arranged in the first direction D1. For example, the plurality of support members 180 of the first group G1 may be aligned with the first connection members 170*a* disposed on one side of the first semiconductor chip 150. In this case, the first group G1 may be disposed in a middle region of the first semiconductor chip 150.

Referring to FIG. 14, in the semiconductor package according to some embodiments, a plurality of support members 180 may constitute each of a second group G2 and a third group G3. Each of the second group G2 and the third group G3 may include a plurality of support members 180 arranged in the second direction D2. The plurality of first connection members 170 may be arranged in the first direction D1 and the second direction D2. The first connection members 170 may be arranged around the first semiconductor chip 150. The plurality of support members 180 of each of the second group G2 and the third group G3 may be aligned with the first connection members 170 arranged in the second direction D2 and disposed on one side of the first semiconductor chip 150. For example, the plurality of support members 180 of the second group G2 may be aligned with the first connection member 170*b* arranged in the second direction D2 and disposed on one side of the first semiconductor chip 150. The plurality of support members 180 of the third group G3 may be aligned with the first connection members 170*c* arranged in the second direction D2 and disposed on one side of the first semiconductor chip 150.

Figure 15:
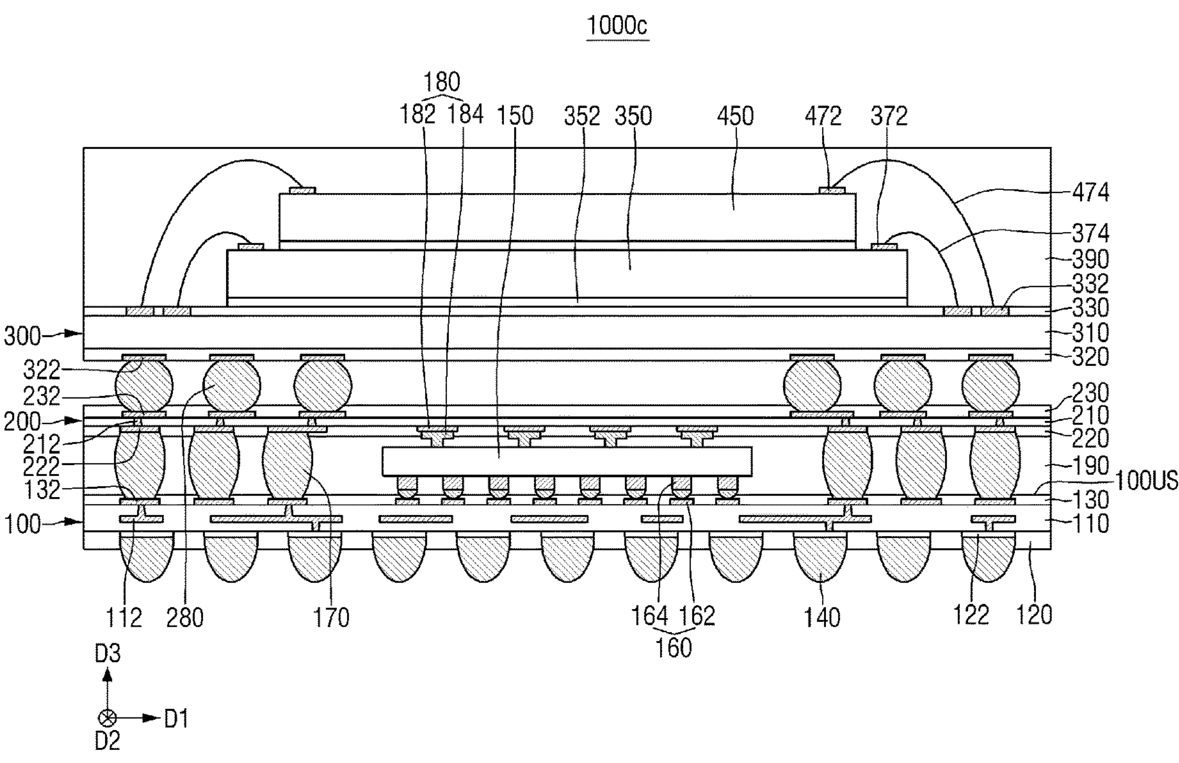
FIG. 15 is a cross-sectional view illustrating a semiconductor package according to an embodiment.

FIG. 15 is a cross-sectional view illustrating a semiconductor package according an embodiment.

Referring to FIG. 15, the second semiconductor chip 350 is mounted on the second substrate 300 using a scheme other than the flip chip bonding scheme.

For example, the second semiconductor chip 350 may be mounted on the second substrate 300 via a first adhesive layer 352. The first adhesive layer 352 may attach a bottom surface of the second semiconductor chip 350 to an upper surface of the second substrate 300 using adhesive means. The first adhesive layer 352 may include or may be formed of, for example, at least one of a liquid epoxy, an adhesive tape, a conductive medium, and a combination thereof. However, the present disclosure is not limited thereto.

In some embodiments, the second semiconductor chip 350 may be electrically connected to the second substrate 300 via a first bonding wire 374. The first bonding wire 374 may connect, for example, the first chip pad 372 of the second semiconductor chip 350 to the fourth upper pad 332 of the second substrate 300. However, the technical spirit of the present disclosure is not limited thereto, and the second semiconductor chip 350 may be electrically connected to the fourth upper pad 332 via, for example, a bonding tape.

In some embodiments, a plurality of semiconductor chips may be stacked on the second substrate 300. For example, a third semiconductor chip 450 may be stacked on the second semiconductor chip 350.

For example, the third semiconductor chip 450 may be disposed on the second semiconductor chip 350 via a second adhesive layer 452. The second adhesive layer 452 may attach a bottom surface of the third semiconductor chip 450 to an upper surface of the second semiconductor chip 350 using adhesive means.

In some embodiments, the third semiconductor chip 450 may be electrically connected to the second substrate 300 via a second bonding wire 474. The second bonding wire 474 may connect, for example, the second chip pad 472 of the third semiconductor chip 450 to the fourth upper pad 332 of the second substrate 300.

Figure 16:
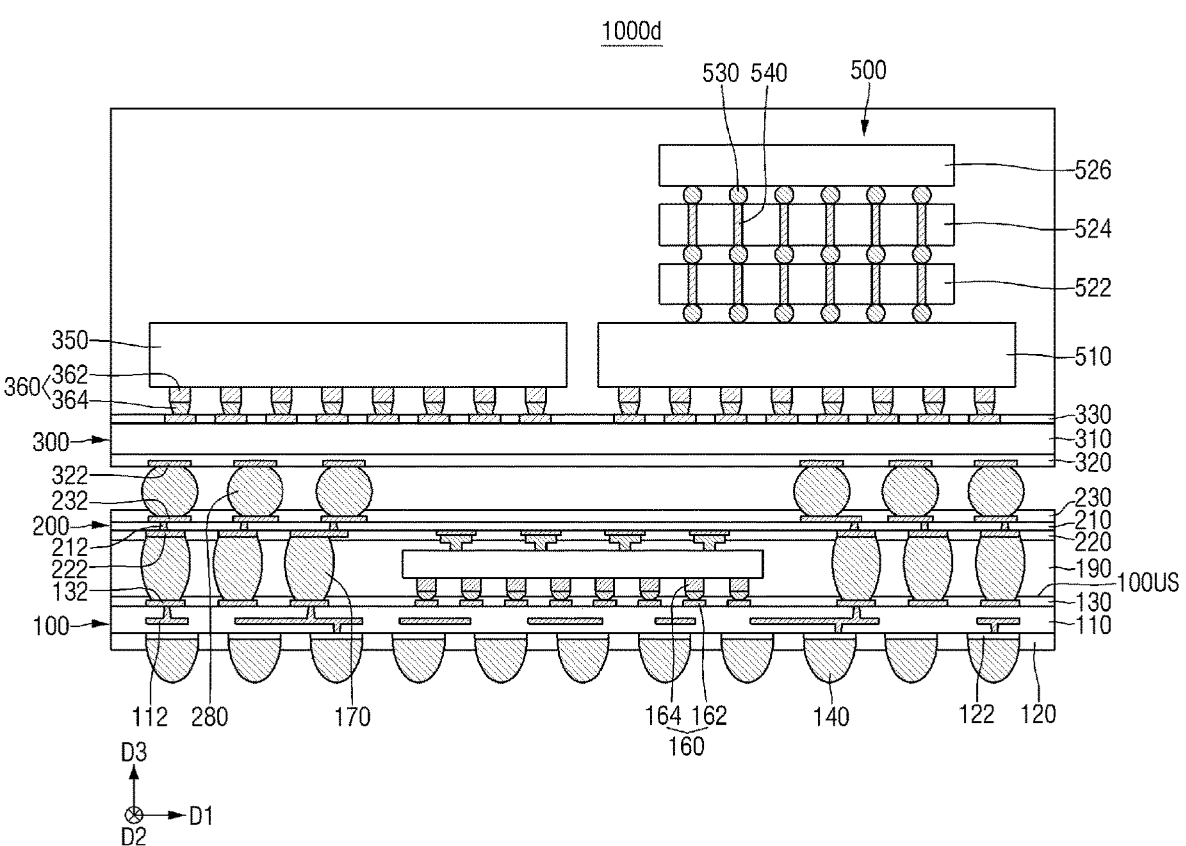
FIG. 16 is a cross-sectional view illustrating a semiconductor package according to an embodiment.

FIG. 16 is a cross-sectional view illustrating a semiconductor package according an embodiment.

Referring to FIG. 16, in some embodiments, a high bandwidth memory (HBM) 500 may be mounted on the second substrate 300. The high bandwidth memory 500 may include, for example, a controller chip 510 and a plurality of memory chips 522, 524, and 526. The controller chip 510 may be mounted on the second substrate 300, and the plurality of memory chips 522, 524, and 526 may be sequentially stacked on the controller chip 510. The controller chip 510 may be embodied as a logic chip, and each of the plurality of memory chips 522, 524, and 526 may be embodied as a memory chip.

In some embodiments, the high bandwidth memory 500 may include a fourth bump 530 and a through via 540. The fourth bump 530 may be interposed between the controller chip 510 and the plurality of memory chips 522, 524, and 526. The through via 540 may extend through the controller chip 510 and at least some of the plurality of memory chips 522, 524, and 526 so as to be connected to the fourth bump 530. Accordingly, the high bandwidth memory 500 may be electrically connected to the first substrate 100 via the interposer 200.

In some embodiments, the high bandwidth memory 500 may be electrically connected to the first semiconductor chip 150 via the interposer 200. For example, a portion of the second conductive pattern 212 may connect the third upper pad 232 in contact with the first semiconductor chip 150 to the third upper pad 232 in contact with the high bandwidth memory 500.

FIG. 17 to FIG. 20 are diagrams of intermediate structures corresponding to intermediate steps for illustrating a process for manufacturing a semiconductor package according to some embodiments.

Figure 17:
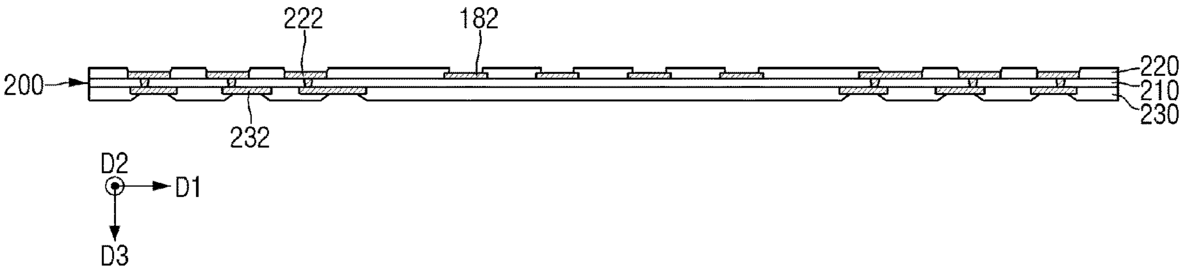
FIG. 17 to FIG. 20 are diagrams of intermediate structures corresponding to intermediate steps for illustrating a process for manufacturing a semiconductor package according to some embodiments.

Referring to FIG. 17, the interposer 200 including the second insulating layer 210, the second lower passivation film 220, and the second upper passivation film 230 may be provided. The interposer 200 may include the bottom and upper surfaces opposite to each other. The interposer 200 in FIG. 17 may be obtained by turning the interposer 200 in FIG. 4 upside down. That is, the upper surface of the interposer 200 described in FIG. 17 may correspond to the bottom surface of the interposer 200 of FIG. 4.

The second lower passivation film 220 may be formed on the second insulating layer 210. The second lower passivation film 220 may cover the bottom surface of the second insulating layer 210 and expose the second lower pad 222 and the third lower pad 182. The second lower pad 222 and the third lower pad 182 may be formed simultaneously, so that the manufacturing process may be simplified.

Figure 18:
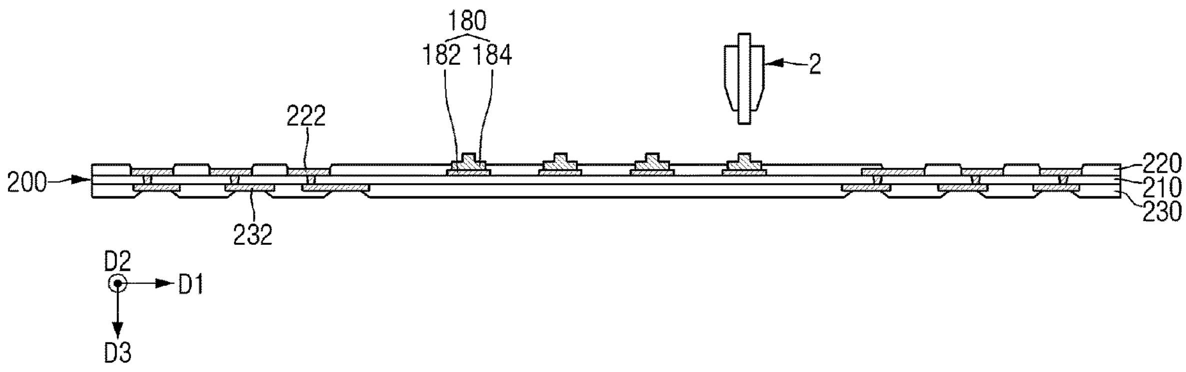

Referring to FIG. 18, the second bump 184 may be formed on the third lower pad 182. The second bump 184 may be formed using manufacturing facility 2. The manufacturing facility 2 may be embodied as, for example, wire bonding facility. The second bump 184 may include or may be formed of at least one of copper (Cu), copper alloy, nickel (Ni), nickel alloy, palladium (Pd), platinum (Pt), gold (Au), and cobalt (Co).

Figure 19:
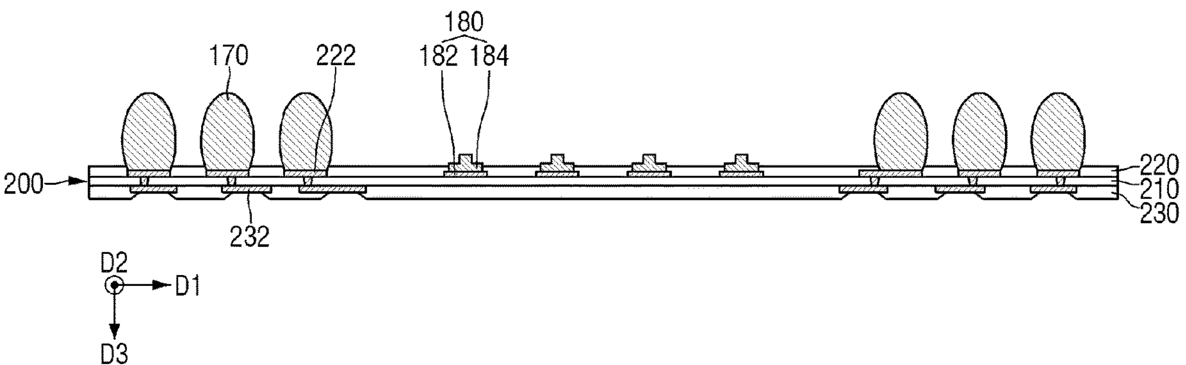

Referring to FIG. 19, the first connection member 170 may be formed on the second lower pad 222. Although it is illustrated that the second bump 184 is first formed and then the first connection member 170 is formed, the present disclosure is not limited thereto. For example, the first connection member 170 may be first formed and then the second bump 184 may be formed. One end of the first connection member 170 may be in contact with the second lower pad 222 so as to electrically connect the first substrate 100 and the interposer 200 with each other later. In some embodiments, the first connection member 170 may include or may be a solder ball. The first connection member 170 may include or may be formed of, for example, at least one of tin (Sn), indium (In), bismuth (Bi), antimony (Sb), copper (Cu), silver (Ag), zinc (Zn), lead (Pb), and a combination thereof. However, the present disclosure is not limited thereto.

Figure 20:
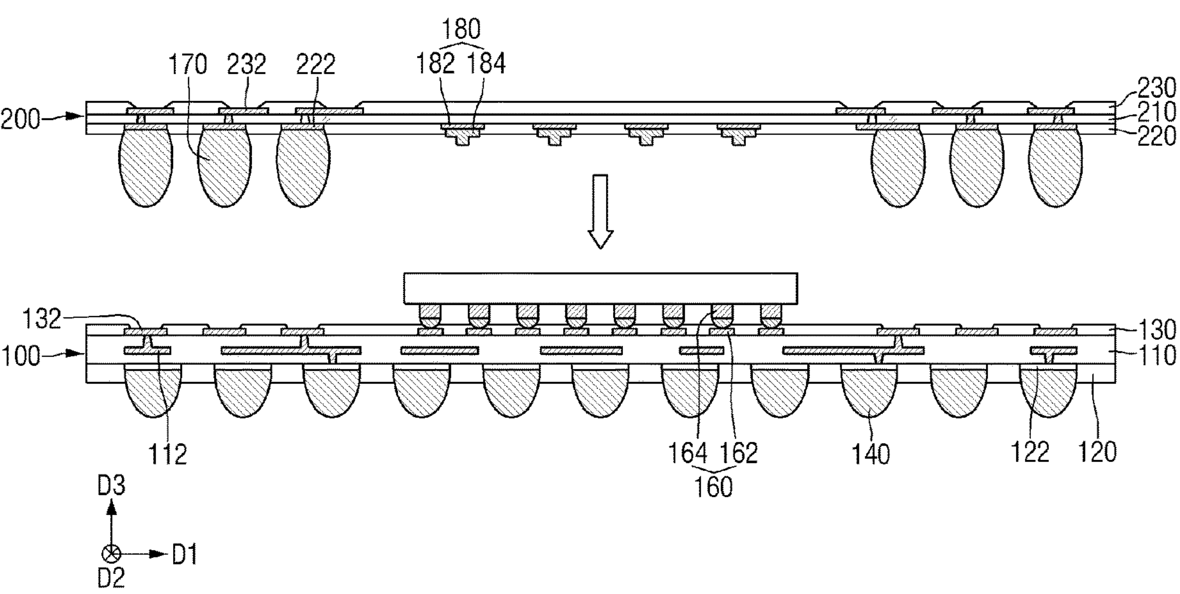

Referring to FIG. 20, the interposer 200 may be bonded onto the first substrate 100. Bonding the interposer 200 onto the first substrate 100 may include, for example, turning the interposer 200 in FIG. 19 upside down and then bringing the turned interposer into contact with the first substrate 100. Specifically, the first connection member 170 contacts the first upper pad 132, and the second bump 184 contacts the upper surface 150US of the first semiconductor chip 150. Subsequently, a bonding scheme that applies heat to the semiconductor package using a bonding mechanism may be carried out.

As the thickness of the interposer 200 decreases, warpage of the interposer 200 may occur during the bonding process. This warpage causes quality of the interposer 200 to deteriorate. In order to prevent defects caused by the warpage, the specific spacing (for example, H2) between the interposer 200 and the first semiconductor chip 150 needs to be maintained. To this end, the interposer 200 may include the above-described support member 180. The support member 180 may support the interposer 200 such that the specific spacing (for example, H1 or H2) between the interposer and the first substrate 100 or the first semiconductor chip 150 is maintained in the process of bonding the interposer 200 onto the first substrate 100.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A semiconductor package comprising:
a first substrate including a first insulating layer, and a first conductive pattern disposed in the first insulating layer;
a semiconductor chip disposed on the first substrate;
an interposer disposed on the semiconductor chip,
wherein the interposer includes a second insulating layer, and a second conductive pattern disposed in the second insulating layer;
a support member disposed on a bottom surface of the second insulating layer and contacting an upper surface of the semiconductor chip,
wherein the support member includes a first lower pad and a bump disposed under the first lower pad; and
a first connection member disposed between the first substrate and the interposer and connecting the first conductive pattern to the second conductive pattern.

2. The semiconductor package of claim 1,
wherein the bump includes a first end having a first area and a second end having a second area, the first end contacting the first lower pad, and the second end contacting the upper surface of the semiconductor chip,
wherein a first width of the first area is greater than a second width of the second area, and
wherein the first and second widths are measured in a direction parallel to the upper surface of the semiconductor chip.

3. The semiconductor package of claim 1,
wherein the bump is sized to have a decreasing width in a direction from the interposer to the first substrate, and
wherein a width of the bump is measured in a direction parallel to an upper surface of the first substrate.

4. The semiconductor package of claim 1,
wherein a distance from the upper surface of the semiconductor chip to a bottom surface of the interposer is selected from a range of 15 μm to 45 μm.

5. The semiconductor package of claim 4,
wherein a distance from the upper surface of the first substrate to a bottom surface of the semiconductor chip is selected from a range of 15 μm to 45 μm.

6. The semiconductor package of claim 1,
wherein a thickness of the interposer is selected from a range of 100 μm to 220 μm, and
wherein the thickness of the interposer is measured in a direction perpendicular to an upper surface of the first substrate.

7. The semiconductor package of claim 1,
wherein the bump includes at least one of copper (Cu), copper alloy, nickel (Ni), nickel alloy, palladium (Pd), platinum (Pt), gold (Au), and cobalt (Co).

8. The semiconductor package of claim 1,
wherein the bump includes a first end having a first area, and a second end having a second area,
wherein the first end contacts the first lower pad and the second end contacts the upper surface of the semiconductor chip,
wherein the first area has a first width and the second area has a second width,
wherein a third width of the first lower pad is equal to the first width of the first area,
wherein the second width of the second area is smaller than the first width of the first area, and
wherein the first to third widths are measured in a direction parallel to an upper surface of the first substrate.

9. The semiconductor package of claim 1,
wherein the first substrate includes:
an upper passivation film covering an upper surface of the first insulating layer; and
a first upper pad disposed on the upper surface of the first insulating layer and exposed via an opening of the upper passivation film,
wherein the interposer includes:
a lower passivation film covering the bottom surface of the second insulating layer; and
a second lower pad disposed on the bottom surface of the second insulating layer and exposed via an opening of the lower passivation film, and
wherein the first connection member contacts the first upper pad and the second lower pad.

10. The semiconductor package of claim 1,
wherein a distance from the upper surface of the semiconductor chip to a bottom surface of the interposer is smaller than or equal to a distance from an upper surface of the first substrate to a bottom surface of the semiconductor chip.

11. A semiconductor package comprising:
a first substrate including a first insulating layer, and a first conductive pattern disposed in the first insulating layer;
a first semiconductor chip disposed on the first substrate;
a plurality of bumps, each bump including a first end having a first area and a second end having a second area,
wherein the second end contacts an upper surface of the first semiconductor chip and is disposed between the first end and the first semiconductor chip,
wherein a first width of the first area is greater than a second width of the second area, and
wherein the first and second widths are measured in a direction parallel to an upper surface of the first substrate;
an interposer disposed on the plurality of bumps, wherein the interposer includes a second insulating layer, and a second conductive pattern disposed in the second insulating layer; and
a first connection member disposed between the interposer and the first substrate, wherein the first connection member is spaced apart from the first semiconductor chip,
wherein the first connection member electrically connects the first conductive pattern to the second conductive pattern.

12. The semiconductor package of claim 11,
further comprising:
a plurality of first lower pads, each first lower pad being disposed between the interposer and a first end of a corresponding bump of the plurality of bumps.

13. The semiconductor package of claim 11,
wherein the interposer includes:
a lower passivation film covering a bottom surface of the second insulating layer; and
a first lower pad disposed on the bottom surface of the second insulating layer and exposed by an opening of the lower passivation film, and
wherein the first end protrudes in a direction from the interposer to the first semiconductor chip beyond a bottom surface of the lower passivation film.

14. The semiconductor package of claim 11,
wherein each bump of the plurality of bumps includes at least one of copper (Cu), copper alloy, nickel (Ni), nickel alloy, palladium (Pd), platinum (Pt), gold (Au), and cobalt (Co).

15. The semiconductor package of claim 11,
wherein the first connection member includes a plurality of first connection members that are arranged between the interposer and the first substrate, and
wherein a distance between adjacent two first connection members of the plurality of first connection members is different from a distance between adjacent two bumps of the plurality of bumps.

16. The semiconductor package of claim 11,
wherein the plurality of bumps are disposed on the first semiconductor chip and arranged in at least one direction.

17. The semiconductor package of claim 11, further comprising:
a second semiconductor chip disposed on the interposer; and
a second connection member electrically connecting the second semiconductor chip to the second conductive pattern.

18. A semiconductor package comprising:
a first substrate including a first insulating layer, and a first conductive pattern disposed in the first insulating layer;
a first semiconductor chip mounted on the first substrate;
an interposer disposed on the first substrate, and spaced apart from the first semiconductor chip, wherein the interposer includes a second insulating layer, and a second conductive pattern disposed in the second insulating layer;
a support member disposed on a bottom surface of the second insulating layer and contacting an upper surface of the first semiconductor chip, wherein the support member includes a first lower pad and a bump disposed under the first lower pad;
a first connection member disposed between the first substrate and the interposer, and spaced apart from the first semiconductor chip, wherein the first connection member connects the first conductive pattern to the second conductive pattern;
a second substrate disposed on the interposer; and
a second semiconductor chip mounted on the second substrate,
wherein the bump includes a first end having a first area, and a second end having a second area disposed under the first end,
wherein the first end of the bump contacts the first lower pad,
wherein a first width of the first area is greater than a second width of the second area, and
wherein the first and second widths of the bump are measured in a direction parallel to an upper surface of the first substrate.

19. The semiconductor package of claim 18,
wherein a spacing from the upper surface of the first semiconductor chip to a bottom surface of the interposer is selected from a range of 5 μm to 45 μm, and
wherein a thickness of the interposer is selected from a range of 100 μm to 220 μm, the thickness of the interposer being measured in a direction perpendicular to the upper surface of the first substrate.

* * * * *